United States Patent
Werthner

(10) Patent No.: US 7,902,824 B2
(45) Date of Patent: Mar. 8, 2011

(54) METHOD FOR TRANSFORMING A DISTORTION-CORRECTED MAGNETIC RESONANCE IMAGE, METHOD FOR CARRYING OUT MAGNETIC RESONANCE MEASUREMENTS, AND IMAGE TRANSFORMATION UNIT

(75) Inventor: Harald Werthner, Zirndorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/662,152

(22) Filed: Apr. 1, 2010

(65) Prior Publication Data

US 2010/0195884 A1 Aug. 5, 2010

Related U.S. Application Data

(62) Division of application No. 11/826,587, filed on Jul. 17, 2007, now Pat. No. 7,782,054.

(51) Int. Cl.
*G01V 3/00* (2006.01)
(52) U.S. Cl. .......................... 324/307; 324/309
(58) Field of Classification Search .......... 324/300–322; 600/410–435
See application file for complete search history.

(56) References Cited

U.S. PATENT DOCUMENTS

| | | | |
|---|---|---|---|
| 4,656,425 A | | 4/1987 | Bendel |
| 4,739,265 A | | 4/1988 | Yamamoto et al. |
| 4,876,509 A | * | 10/1989 | Perlmutter .................... 324/309 |
| 4,922,915 A | * | 5/1990 | Arnold et al. ................. 382/128 |
| 5,617,029 A | | 4/1997 | Schneider |
| 5,701,074 A | * | 12/1997 | Zhu ............................... 324/307 |
| 5,886,524 A | * | 3/1999 | Krieg ............................. 324/312 |
| 6,252,401 B1 | | 6/2001 | Werthner et al. |
| 6,528,998 B1 | | 3/2003 | Zhou et al. |
| 6,603,989 B1 | | 8/2003 | Yablonskiy |
| 7,088,099 B2 | | 8/2006 | Doddrell et al. |
| 7,271,588 B2 | | 9/2007 | Frydman |
| 7,330,026 B2 | | 2/2008 | Wang et al. |
| 7,443,164 B2 | | 10/2008 | Clarke et al. |
| 2005/0024051 A1 | | 2/2005 | Doddrell et al. |

FOREIGN PATENT DOCUMENTS

| | | |
|---|---|---|
| DE | 198 29 850 A1 | 1/2000 |
| EP | 0 146 873 A2 | 7/1985 |
| WO | WO 2006/056912 A1 | 6/2006 |

OTHER PUBLICATIONS

M. Breeuwer et al. Detection and correction of geometric distortion in 3D MR Images Proc. SPIE 4322 (2001), p. 1110-1120.
Jan Weis, Lubos Budinsky Simulation of the Influence of Magnetic Field Inhomogeneity and Distortion Correction in MR Imaging Magnetic Resonance Imaing, vol. 8, 1990.

* cited by examiner

*Primary Examiner* — Melissa J Koval
*Assistant Examiner* — Dixomara Vargas
(74) *Attorney, Agent, or Firm* — Harness, Dickey & Pierce, P.L.C.

(57) ABSTRACT

A method for carrying out magnetic resonance measurements on an examination object in a magnetic resonance system is described. In at least one embodiment, a magnetic resonance image of the examination object previously acquired via the magnetic resonance system is used to determine spatial coordinates in order to control the magnetic resonance system for the magnetic resonance measurement to be carried out. In this case, in order to determine the spatial coordinates, use is made of a distortion-corrected magnetic resonance image generated on the basis of an original magnetic resonance measured image acquired by the magnetic resonance system and transformed in advance into an equivalent measured image on the basis of field inhomogeneity values of the magnetic resonance system.

18 Claims, 5 Drawing Sheets

US 7,902,824 B2

METHOD FOR TRANSFORMING A DISTORTION-CORRECTED MAGNETIC RESONANCE IMAGE, METHOD FOR CARRYING OUT MAGNETIC RESONANCE MEASUREMENTS, AND IMAGE TRANSFORMATION UNIT

PRIORITY STATEMENT

This application is a divisional of application Ser. No. 11/826,587 filed Jul. 17, 2007 now U.S. Pat. No. 7,782,054 which claims priority under 35 U.S.C. §119 on German patent application number DE 10 2006 033 248.2 filed Jul. 18, 2006, the entire contents each of which are hereby incorporated herein by reference.

FIELD

Embodiments of the invention generally relate to a method for carrying out magnetic resonance images on an examination object in a magnetic resonance system. For example, they may relate to one in the case of which a magnetic resonance image of the examination object previously acquired by way of the magnetic resonance system is used to determine spatial coordinates in order to control the magnetic resonance system for the magnetic resonance measurement to be carried out. Furthermore, embodiments of the invention generally relate to a method, such as one which can be used for this purpose, for example. The method may relate to one for transforming a distortion-corrected magnetic resonance image, generated on the basis of an original magnetic resonance measured image acquired by a magnetic resonance system into an equivalent measured image, which substantially matches the original magnetic resonance measured image. Furthermore embodiments of the invention generally relate to an image transformation unit, such as one for transforming a distortion-corrected magnetic resonance image acquired by a magnetic resonance system and generated on the basis of an original magnetic resonance measured image into an equivalent measured image, and/or to a magnetic resonance image with such an image transformation unit.

BACKGROUND

Magnetic resonance tomography, also termed nuclear magnetic resonance tomography, involves the technique, which has become wide spread in the interim, for obtaining images of the body interior of a, usually living, examination object. In order to obtain an image with the aid of this method, it is firstly necessary to expose the body or the body part of the patient or test subject that is to be examined to a static basic magnetic field that is generated by a basic field magnet of the magnetic resonance system. During the acquisition of the magnetic resonance images, rapidly switched gradient fields that are generated by so called gradient coils are superposed on this basic magnetic field for the purpose of location coding.

Moreover, radiofrequency antennas are used to irradiate radiofrequency pulses of a defined field strength into the examination object. The nuclear spins of the atoms in the examination object are excited by way of these radiofrequency pulses in such a way that they are deflected from their equilibrium position parallel to the basic magnetic field by a so called "excitation flip angle". The nuclear spins then precess about the direction of the basic magnetic field.

The magnetic resonance signals generated thereby are picked up by radiofrequency receiving antennas. Finally, the magnetic resonance images of the examination object are prepared on the basis of the received magnetic resonance signals. Each image pixel in the magnetic resonance image is in this case assigned to a small body volume, a so called "voxel", and each brightness or intensity value of the image pixels is combined with the signal amplitude, received from this voxel, of the magnetic resonance signal.

It is clear that there is a need for the presence of the most homogeneous fields possible in this method in order to obtain suitable images. Thus, for example, field inhomogeneities of the gradient magnetic fields mean that an object is shown in a two-dimensional sectional image in a distorted fashion. If the inhomogeneities of the gradient magnetic field are known, a specific algorithm can be used to carry out a distortion correction in order to generate from such an original measured image a distortion-corrected image that correctly reproduces the proportions of the object. The mathematical formulation of such a two-dimensional distortion and of the possible distortion correction is described, for example, in the article "Simulation of the Influence of Magnetic Field Inhomogeneity and Distortion Correction in MR Imaging" by Ján Weiš and Lúbos Budinský in Magnetic Resonance Imaging, vol. 8, 1990.

In order, furthermore, to keep the inhomogeneities in the basic magnetic field as slight as possible when undertaking magnetic resonance measurement, a switch is being made more and more to using a so called isocenter scanning method for measurement. In this case, all layers as near as possible to the isocenter of the magnetic resonance unit or the basic magnet are measured by appropriately displacing the table on which the patient or test subject lies during the measurement. The result of this is that large image fields such as, for example, the spinal column cannot be measured all at once. Such a measurement must then be decomposed into a number of measuring steps, a measurement being carried out station by station at the isocenter of the magnetic resonance magnet. In order then to be able to reassemble the individual images generated in this case to form an overall image, it is necessary for them to be subjected to two-dimensional distortion correction, something which can be performed in the known way.

In the routine operation, a very large portion of the patient is in the mean time being examined using such an isocenter scanning method, the images always being subjected to distortion correction as described. In most cases, however, a spectroscopy is then further arranged by a doctor responsible after looking through the images. Thus, for example, in the case of a so called "single voxel spectroscopy" a number of voxels are selected in a defined area in the sectional image of the patient/test subject, and there is then generated for these a frequency spectrum with the aid of which metabolites can be identified. The zone in which this spectroscopy is to be carried out is defined as a rule in this case directly in the magnetic resonance images present with the aid of a graphics user surface.

If, for this purpose, the distortion-corrected images are used the problem occurs the subsequent measurement may be carried out at the wrong location. This may be explained with the aid of FIG. 1. There, the frequency f with which a specific location x is selected in the event of the emission of the corresponding radiofrequency pulses is plotted against the pertinent location x. In an ideal, that is to say completely homogeneous field, which corresponds to the ideal line depicted (dotted line), a real location $x_0$ in the examination object is also illustrated at the location $x_0$ in the image. This ideal behavior also indicates a distortion-corrected image. If the graphics user interface were now to be used for the spectroscopy to select exactly this point $x_0$ in a distortion-corrected image, the measurement would however, operate with the frequency $f_2$, since, after all, field inhomogeneities actually are present in reality. This would have the effect that finally, during the spectroscopy measurement the wrong location $x_2$ would be excited in the examination object instead of the correct location $x_0$, since the frequency $f_2$ corresponds to the location $x_2$ in accordance with the relationships actually present (continuous line). Thus, the distorted original measured image is required in order to select the correct location for a subsequent spectroscopy measurement.

In this original measured image, a location $x_0$ is assigned a frequency $f_0$ that is then displayed at the point $x_1$ in the distortion-corrected image. It is then possible to select in this image the anatomy of the location $x_0$ at the pixel $x_1$ which contains the information relating to the location $x_0$. The measurement is duly carried out thereupon with the frequency $f_0$ such that measurement is performed correspondingly in the examination object at the location $x_0$. That is to say, when selecting is specific anatomy at the pixel $x_1$ in the distorted original measured image this is then also actually measured even if this anatomy lies at the location $x_0$ in the real examination object.

This gives rise to the problem that, on the one hand, distortion-corrected images are required in order actually to be able to assemble images in an isocenter scanning method and, on the other hand, undistorted images are needed in order to be able to plan and correctly control subsequent measurements. It is certainly true that it would be possible for each magnetic resonance measurement with the aid of an isocenter scanning method also to store the distorted original images in the database in addition to the distortion-corrected images.

However, this is not expedient, since then the data volume to be stored is unnecessarily increased. It is to be taken into account here that, after all, only a very small portion of the images initially generated are actually used for later precise planning and control of a subsequent measurement. Since, consequently, virtually twice as many images than are actually required must be handled in the image calculation, transferred and input into the database, this necessarily results in the fact that the performance of each image calculation is worsened.

This leads overall to the fact that the examination time per patient is lengthened and the patient throughput is reduced. In addition, it can be that a few examination sequences can no longer be carried out at all, such as, for example, spectroscopies with contrast agents, since the period for preparing the first images and the further planning and determination of the location for the subsequent spectroscopy measurements lasts so long that the contrast agent is already washed out.

As an alternative it would be possible to repeat a part of the measurement before planning a spectroscopy, in order to obtain the required localization images not corrected for distortion. However, this is likewise not acceptable, since this, too, also leads to a substantial time loss and is attended by additional burdens for the patient. Here, as well, it can happen in the case of a contrast agent measurement that the actual spectroscopy measurement is no longer possible since the contrast agent has already been washed out, as conditioned by the time loss for the measurement of the additional images for planning this spectroscopy.

The outcome of this set of problems in reality was that it has so far not actually been possible to apply any isocenter scanning methods when there is a subsequent spectroscopy measurement to be carried out correctly.

SUMMARY

In at least one embodiment, the present invention specifies appropriate methods and devices with the aid of which at least one of the above-named set of problems is reduced or even circumvented.

In the case of the measuring method according to at least one embodiment of the invention, the spatial coordinates are determined simply on the basis of a distortion-corrected magnetic resonance image generated on the basis of an original magnetic resonance measured image acquired by the magnetic resonance system, the magnetic resonance image being, however, back transformed into an "equivalent measured image" on the basis of the field inhomogeneity values of the magnetic resonance system. That is to say, the problem is finally solved in the way that the original measured images are certainly corrected for distortion and are stored as previously in the isocenter scanning method as distortion-corrected magnetic resonance images. However, after such a distortion-corrected magnetic resonance image has been selected in order to carry out therein the plans for subsequent measurements, for example in order to determine the spatial coordinates for a subsequent spectroscopy measurement, the magnetic image is then again back transformed in advance into an equivalent measured image that substantially corresponds to the original magnetic resonance measured image. Such a back transformation can be carried out substantially more quickly than a new measurement of a measured image in the required area that has not been corrected for distortion. It is likewise not necessary in the method to archive all the original measured images in addition to the distortion-corrected magnetic resonance images. The entire method can therefore be carried out quickly and, above all, also cost effectively and with less of a burden for the patient.

A particularly suitable inventive transformation method of at least one embodiment, for transforming such a distortion-corrected magnetic resonance image into an equivalent measured image, is disclosed in detail below. In this case, the following method steps are respectively carried out for the individual pixels defined in an image raster of the distortion-corrected magnetic resonance image:

It is firstly necessary to determine the field inhomogeneity values of the magnetic resonance system at the location of the relevant pixel. Such field inhomogeneity values of the magnetic resonance system are usually known, that is to say they are calculated or measured before a measurement and stored in a database since they are required in any case for the distortion correction itself. The determination of the field inhomogeneity values can therefore be performed by accessing the relevant memory in which the field inhomogeneity values are stored.

A displacement of the relevant pixel is then calculated on the basis of the determined field inhomogeneity values. That is to say, it is determined to where a specific pixel would be displaced in a measured slice of the examination object during measurement by the field inhomogeneity values actually occurring in the original measured image. Finally, this real displacement also corresponds to the displacement that must take place in the back transformation from the distortion-corrected image to the equivalent measured image.

Furthermore, a distorted area of the relevant pixel is then calculated on the basis of the determined field inhomogeneity values. It is determined in this case how a pixel of the examination object would be compressed or expanded because of the field inhomogeneities in the original measured image. This, as well, must in turn be taken into account in a back transformation of the distortion-corrected magnetic resonance image into the equivalent measured image.

Subsequently, an overlap of this displaced and distorted area of the relevant pixel with the areas of the pixels defined in an image raster of the equivalent measured image is then calculated. It is then possible for the intensity value of the relevant pixel of the distortion-corrected magnetic resonance image to be split between the pixels of the equivalent measured image in accordance with the determined overlap.

If this method is now executed for each individual pixel of the distortion-corrected magnetic resonance image, and the appropriate intensity values in the pixels are summed up in the image raster of the equivalent measured image, this yields the desired equivalent measured image, which corresponds substantially to the original measured image, apart from approximation errors, rounding errors etc. This transformation method is relatively fast and can therefore preferably be used in the course of the measuring method according to the invention. However, it is, moreover, also possible to conceive other uses of the transformation method according to an embodiment of the invention.

In addition to an interface for acquiring a distortion-corrected magnetic resonance image, this possibly being an interface with a customary image reconstruction unit and/or an image memory, a corresponding image transformation unit requires a field inhomogeneity determination unit for determining field inhomogeneity values of the magnetic resonance system. It is also likewise possible here for this to be an interface for accessing a corresponding data memory with these values. Furthermore, there is a need for an image pixel calculating unit that is appropriately designed such that it carries out the above-named method steps of at least one embodiment for the individual pixels defined in an image raster of the distortion-corrected magnetic resonance image, and distributes the intensity values between the pixels of the equivalent measured image and sums them up. Moreover, the image transformation unit requires a suitable interface for outputting the equivalent measured image.

Such an image transformation unit is preferably integrated in a magnetic resonance system, for example in a control terminal of the magnetic resonance system at which the operator can also input the planning data for the subsequent measurements at the same time. However, it is also possible in principle to implement such an image transformation unit in another computer unit.

It is particularly preferred to implement the components required for the image transformation unit, that is to say the interfaces, the field inhomogeneity determination unit and the pixel calculating unit, in the form of image software modules on a computer unit. By contrast with a hardware implementation, such a software implementation has the advantage that even already existing magnetic resonance systems can easily be retrofitted. The invention consequently comprises a computer program product that can be loaded directly into a memory of a programmable computer unit, for example in a control device of a magnetic resonance system, having program code segments, in order to execute all the steps of the method according to at least one embodiment of the invention when the program is executed on the computer unit.

The dependent claims respectively contain particularly advantageous refinements and developments of embodiments of the invention, it being possible, in particular, also to develop further the measuring method according to embodiments of the invention in accordance with the dependent claims of the transformation method according to embodiments of the invention. Likewise the image transformation unit according to at least one embodiment of the invention can be developed further in accordance with the dependent claims of the measuring method and the transformation method.

Since the area, distorted on the basis of the field inhomogeneity values, of a pixel of the distortion-corrected magnetic resonance image can appear relatively complicated, this is approximated for the image transformation in order to reduce the computational outlay, preferably by an area having a simple geometric shape. What is meant by simple geometric shape for this purpose are triangles, rectangles, circles, polygons or other geometric shapes with a known area given specific dimensions.

The distorted area of a pixel of the distortion-corrected magnetic resonance image is approximated with particular preference by an octagonal or rectangular area. As is further shown later on, an octagon or a rectangle are areas in the case of which the dimensions of the distorted or the approximated distorted area of a pixel can be determined in a particularly simple way on the basis of direction-dependent Jacobi factors that respectively represent a local field gradient at the location of the relevant pixel. The location-dependent and direction-dependent Jacobi factors are usually determined and stored in any case in advance for a specific measurement or a magnetic resonance unit, in order to use these for the distortion correction, as well.

In order to distribute the intensity values of the relevant pixel of the distortion-corrected magnetic resonance image between the pixels of the equivalent measured image in accordance with the determined overlap in a simple way, it is particularly preferred respectively to determine for the relevant pixel weighting factors that respectively represent the overlap of the distorted or approximated distorted area of the relevant displaced pixel with an area of a pixel of the equivalent measured image. The splitting of intensity value of the relevant displaced pixel of the distortion-corrected magnetic resonance image between the pixels of the equivalent measured image then is performed in a fashion proportional to the determined weighting factors.

At least for a few pixels of the equivalent measured image, specifically the edge pixels that overlap only partially with the displaced and distorted or approximated distorted area, it is possible here for the weighting factors to be determined as a function of a distance of the respective midpoint of the relevant pixel of the equivalent measured image from the centroid of the displaced and distorted or approximated distorted area of the relevant pixel.

Furthermore, the weighting factors are preferably determined as a function of the number of the pixels of the equivalent measured image with the aid of which the distorted or approximated distorted surface at least partially overlaps.

It has proved to be advantageous for a particularly simple and rapid calculation when inhomogeneity intervals are defined, in a specific direction of the image raster, as a function of a distance of the centroid of the distorted or approximated distorted area of the relevant pixel of the distortion-corrected image from the midpoint of the nearest pixel of the equivalent measured image. These inhomogeneity intervals are then respectively assigned specific weighting factors for the individual pixels of the equivalent measured image as a function of the distance of the midpoint of the distorted or approximated distorted area from the midpoint of the nearest pixel. It may then only be tested as to whether the direction-dependent Jacobi factor present at the relevant pixel of the distortion-corrected magnetic resonance image lies in a specific intensity interval. If this is the case, the intensity fractions are correspondingly assigned to the relevant pixels of the equivalent measured image, which overlap with the distorted or approximated distorted area, in accordance with the weighting factors that are assigned to this intensity interval.

As mentioned, in this case the weighting factors are also a function of the distance of the midpoint of the distorted or approximated distorted area from the midpoint of the nearest pixel. That is to say, what is involved here in the actual sense is a weighting function that depends on this distance. This calculation can preferably be performed separately in any direction of the image raster (column direction and row direction), and there are then formed, for example by multiplying the direction dependent weighting factors thus determined for each pixel, overall weighting factors with the aid of which the fraction of the intensity value of a pixel of the distortion-corrected image that falls to the individual pixels of the equivalent measured image can be calculated.

The intensity values are preferably normalized before the division as a function of a Jacobi factor, for example are divided by the product of the location-dependent Jacobi factors present at the relevant pixel.

The abovedescribed transformation method according to at least one embodiment of the invention can be carried out very particularly quickly and simply. Nevertheless, the measuring method according to at least one embodiment of the invention can also be carried out in principle by using other transformation methods as long as it is ensured that the equivalent measured image corresponds sufficiently to the original measured image for it thus to be possible to carry out a reliable determination of spatial coordinates.

As previously described, the measuring method according to at least one embodiment of the invention is particularly suitable for using the equivalent measured image to obtain spatial coordinates for a subsequent spectroscopy measurement. That is to say, the method according to at least one embodiment of the invention now permits images obtained with the aid of an isocenter scanning method also to be used for subsequent spectroscopy measurements without having to accept the disadvantages mentioned at the beginning. However, the method can also be used in principle for other subsequent measurements such as, for example, chemical shift imaging (CSI).

BRIEF DESCRIPTION OF THE DRAWINGS

The invention is explained in more detail below once again with reference to the attached figures and with the aid of example embodiments. Here, the same components are provided with identical reference symbols in the various figures. In the drawings.

DETAILED DESCRIPTION OF THE EXAMPLE EMBODIMENTS

Figure 1:
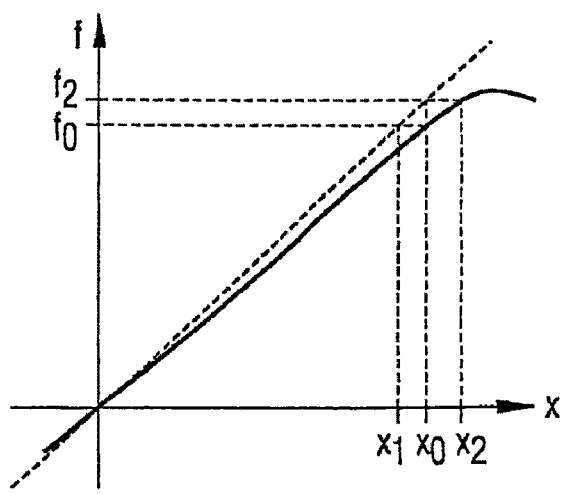
FIG. 1 shows a diagram for explaining the problem of determining the location of specific voxels in the case of distortion-corrected images.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described. Like numbers refer to like elements throughout. As used herein, the terms "and/or" and "at least one of" include any and all combinations of one or more of the associated listed items.

The set of problems that arises when positional data for a subsequent single voxel spectroscopy measurement are to be determined with the aid of a distortion-corrected image, and the magnetic resonance system is to be driven using these data has already been explained at the beginning with the aid of FIG. 1. The wrong frequency is then necessarily selected owing to the distortion correction, and measurement is consequently made at a wrong location. Images that are not distortion-corrected must therefore be present for the determination of spatial coordinates in relation to the subsequent measurement.

This is achieved in accordance with the invention by virtue of the fact that an "inverse distortion correction" is carried out with the aid of the images, and thus the distortion-corrected image is back transformed again before the determination of the spatial coordinates on the basis of the field inhomogeneity values of the magnetic resonance system into an equivalent measured image that corresponds substantially to the original magnetic resonance measured image. It is then possible in this equivalent measured image to plan the further measurements and determine spatial coordinates for the further measurements.

Figure 2:
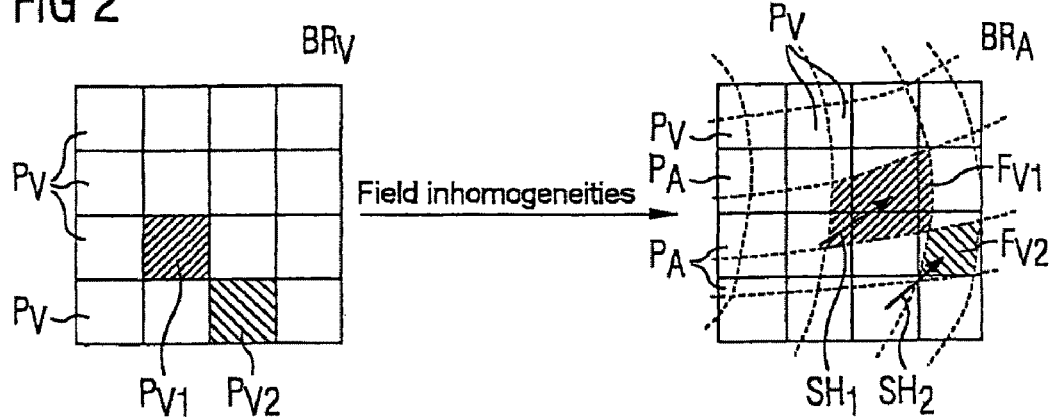
FIG. 2 shows an illustration of the distortion of two pixels that is caused by the field inhomogeneities of the gradient magnetic field.

The basic principle of such an inverse distortion correction resides in the fact that the pixels are displaced and distorted in the image raster of the undistorted, distortion-corrected image in a way which also happens with the real voxels in the examination object in a specific sectional image plane when they are imaged in the original measured image by the magnetic resonance measurement. Reference may be made to FIG. 2 to this end. The left-hand side shows an image raster $BR_V$ of an undistorted, distortion-corrected image that consists of a number of image pixels $P_V$ (only 4×4 pixels being illustrated here for the sake of simplicity). These pixels $P_V$ are displaced and stretched or compressed by the field inhomogeneities, something which is caused by distortion of the entire image raster $BR_V$. This is shown on the right-hand side of FIG. 2, where the image raster $BR_V$ of the distortion-corrected image is illustrated in distorted form with dashed lines.

Superposed thereon with continuous lines is an image raster $BR_A$ of the equivalent measured image that corresponds to the image raster of the actual original measured image, with the individual pixels $P_A$. These images therefore also reflect how an object is illustrated in a distorted fashion without a distortion correction owing to the field inhomogeneities of the gradient coils. The distortion in the geometry and in the intensity at a specific location is a function in this case of the local field gradient of the inhomogeneity.

The different effects on the individual image pixels illustrated in this case in FIG. 2 explicitly are two different image pixels $P_{V1}, P_{V2}$. The two of these are respectively displaced in a specific direction by a specific displacement vector $SH_1$, $SH_2$. Moreover, the distortion has the effect that one pixel $P_{V1}$ is stretched in various directions and therefore assumes a larger distorted area $F_{V1}$. The second pixel $P_{V2}$, by contrast, is compressed in various directions and therefore assumes a smaller distorted area $F_{V2}$. The original intensity of the individual pixels is respectively distributed in this case over the distorted area $F_{V1}$, $F_{V2}$ such that in addition to the geometric distortion a change in intensity also occurs at the individual points. Finally, it is therefore necessary for the pixels not only to be displaced, but also to be adapted in their brightness with the aid of a specific intensity interpolation as is further described below.

The local field gradient of the inhomogeneity at a specific pixel can be expressed by means of the direction-dependent Jacobi factor. Arranging the Jacobi factors in a matrix in accordance with their direction rule derivative results in the so called Jacobi matrix, which characterizes transformation between the distorted and undistorted image.

A 2D distortion as in the present case is a projection in the form of:

$$\begin{pmatrix} x \\ y \end{pmatrix} \mapsto \begin{pmatrix} f_x \\ f_y \end{pmatrix} = \begin{pmatrix} x + \Delta B(x,y)/G_x \\ y + \Delta B(x,y)/G_y \end{pmatrix} = \begin{pmatrix} x \\ y \end{pmatrix} + \begin{pmatrix} \Delta B(x,y)/G_x \\ \Delta B(x,y)/G_y \end{pmatrix}. \quad (1)$$

Here, $\Delta B(x,y)$ is the gradient field inhomogeneity as a function of the location (x, y) which can be measured in advance once for the present gradient field of the magnetic resonance system and/or be calculated from the coil geometry. $G_j$ in each case specifies the set desired gradient at the relevant location in the direction j.

The entire term $$\begin{pmatrix} \Delta B(x,y)/G_x \\ \Delta B(x,y)/G_y \end{pmatrix} \quad (2)$$

therefore constitutes the geometric displacement of an original pixel. When a slice to be measured has been selected by the user on the magnetic resonance unit, the spatial coordinates of all the voxels (or pixels within the selected image plane) are known. Since, moreover, as explained above, the spatially dependent inhomogeneities $\Delta B(x,y)$ of the gradient coils are known it is also possible to calculate the displacement vector ($SH_1$, $SH_2$ in FIG. 2), that is to say the distance vector between distorted and undistorted pixels, for each pixel position with the aid of equation (2). A more detailed formula for calculating the distance vector is to be found, for example, in DE 10 2004 031 983.

The Jacobi matrix can then be defined as:

$$J = \begin{pmatrix} J_x & J_{xy} \\ J_{yx} & J_y \end{pmatrix} = \begin{pmatrix} \dfrac{\partial f_x}{\partial x} & \dfrac{\partial f_x}{\partial y} \\ \dfrac{\partial f_y}{\partial x} & \dfrac{\partial f_y}{\partial y} \end{pmatrix}. \quad (3)$$

$J_x, J_y, J_{xy}, J_{yx}$ are the direction-dependent Jacobi factors here.

The precise mathematical formulation of the 2D distortion is described in the article by Ján Weiš and Lúbos Budinský already indicated at the beginning.

As is easy to see from FIG. 2, a square pixel in an image plane of an object is generally distorted by the field inhomogeneities onto an area that cannot be described exactly by a simple geometric shape such as a triangle, a rectangle, a polygon or another geometric shape with a simple known area.

In order not to configure the back transformation method too intensively with regard to computation, the actually complicated area is therefore preferably approximated by a simple geometric shape in the case of the inverse distortion correction. Possibilities for such an approximation are illustrated in FIG. 3, recourse being made to the example of the distortion of the pixels $P_{V1}$, $P_{V2}$ in FIG. 2.

In the image at far left, the distorted areas $F_{V1}$, $F_{V2}$ are approximated by simple rectangular areas $FA_{V1}$, $FA_{V2}$. The approximation is performed by lozenge-shaped areas $FA'_{V1}$, $FA'_{V2}$ in the middle image, and by octagonal areas $FA''_{V1}$, $FA''_{V2}$ in the image on the far right.

The extent of these areas in the various directions is a function in this case of the direction dependent Jacobi factors. As is to be seen in FIG. 3 at right, an octagon can be described by way of the Jacobi factors on the main diagonals $J_x$ and $J_y$, and, furthermore, by means of the Jacobi factors $J_{xy}$ and $J_{yx}$ on the secondary diagonals.

Figure 3:
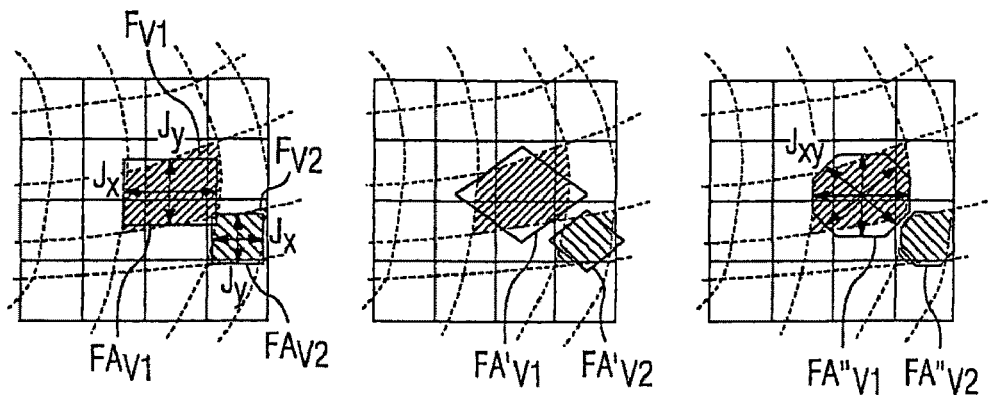
FIG. 3 shows an illustration of various possibilities of approximating the distorted area by way of standard geometric shapes.

However, an example of a rectangular approximation shown on the left-hand side in FIG. 3 constitutes the simplest case of such an approximation. Such a simple approximation is assumed below, since it is possible in this way to minimize the computing time for the inverse distortion correction. Only the Jacobi factors in the direction of the two main axes are then used for the edge length of the approximated rectangular areas $FA_{V1}$, $FA_{V2}$ in the inverse distortion correction. $J_x$ is the extent in the x-direction (row direction), and $J_y$ the extent in the y-direction (column direction) of the image raster of the equivalent measured image, as is illustrated in the left-hand image in FIG. 3.

Figure 4:
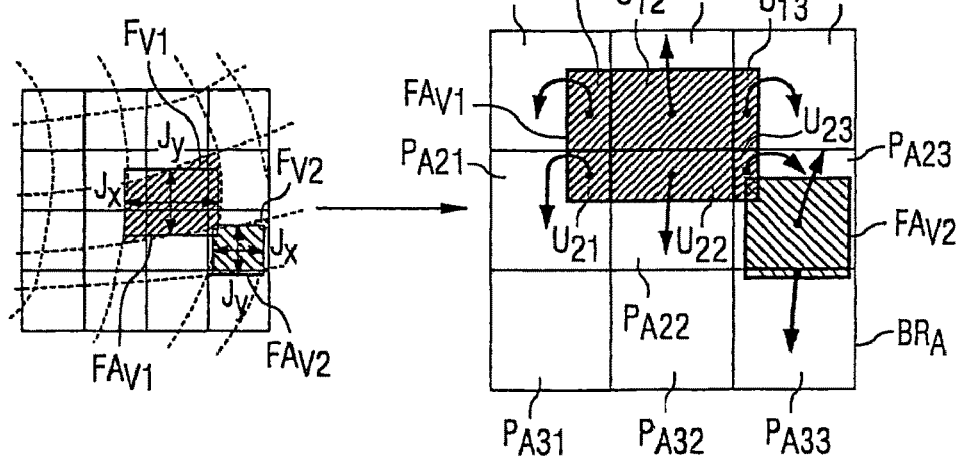
FIG. 4 shows an illustration for explaining the basic principle of the image transformation according to an embodiment of the invention.

The fundamental mode of procedure for calculating the individual image pixels of the equivalent measured image is explained with the aid of FIG. 4. Illustrated again on the left-hand side is the image raster that is shown on the left hand side in FIG. 3 and has the individual pixels of the equivalent measured image and on which there is superposed the distorted and displaced areas of the image pixels $F_{V1}$, $F_{V2}$ of the image pixels $P_{V1}$, $P_{V2}$ of the distortion-corrected image. As has been said, these areas are approximated with the aid of rectangular areas $FA_{V1}$, $FA_{V2}$ whose extent in the two directions is respectively determined by the direction-dependent Jacobi factors $J_x$, $J_y$ at the location of the relevant pixel $P_{V1}$, $P_{V2}$ of the distortion-corrected image.

Illustrated on the right-hand side of FIG. 4 is an enlarged part of this image raster that contains only the lower right hand area, 3×3 pixels in size, of the left-hand image in FIG. 4. It is illustrated here schematically that the image intensity of the original pixels $P_{V1}$, $P_{V2}$ in the distortion-corrected measured image, which is now distributed between the approximated distorted areas $FA_{V1}$, $FA_{V2}$, relates not only to a single image pixel of the equivalent measured image, since, after all, the approximated distorted areas $FA_{V1}$, $FA_{V2}$ lie in a fashion offset from the image raster $BR_A$ of equivalent measured image. The image intensity of the individual pixels is therefore distributed in accordance with the respective overlap of the approximated distorted area $FA_{V1}$, $FA_{V2}$ of the relevant image pixels $P_{V1}$, $P_{V2}$ between the pixels $P_{A11}$, $P_{A12}$, $P_{A13}$, $P_{A21}$, $P_{A22}$, $P_{A23}$, $P_{A31}$, $P_{A32}$, $P_{A33}$.

In the example illustrated in concrete terms, the intensity from the pixel $P_{V1}$ originally present in the undistorted image raster $BR_V$ of the distortion-corrected image is distributed between the three pixels in the upper row $P_{A11}$, $P_{A12}$, $P_{A13}$ and in the middle row $P_{A12}$, $P_{A21}$, $P_{A23}$, since these pixels overlap with the distorted area $FA_{V1}$. Which intensity fraction is assigned to the individual new pixels $P_{A11}$, $P_{A12}$, $P_{A13}$, $P_{A21}$, $P_{A22}$, $P_{A23}$, is a function of how large the overlap $U_{11}$, $U_{12}$, $U_{13}$, $U_{21}$, $U_{22}$, $U_{23}$ is between the rectangular area $FA_{V1}$ and the relevant pixels $P_{A11}$, $P_{A12}$, $P_{A13}$, $P_{A21}$, $P_{A22}$, $P_{A23}$.

In the same way, the intensity of the second pixel $P_{V2}$ in the undistorted image raster $BR_V$ is distributed between the pixels $P_{A23}$, $P_{A33}$ in the equivalent measured image, since the area $FA_{V2}$ overlaps with these two pixels $P_{A23}$, $P_{A33}$. It is clear that in the case of the example illustrated in FIG. 4, the predominant portion of the intensity is assigned to the pixel $P_{A23}$, and the pixel $P_{A33}$ obtains only a very small fraction of the intensity value of the original pixel $P_{V2}$ because of the small overlap.

If a pixel of the distortion-corrected image were accidentally also only to fall into one pixel in the equivalent measured image, it is then clear that the entire intensity is assigned to this pixel.

In accordance with the above explained basic idea, the following steps are carried out for each individual pixel of the original distortion-corrected image within the image transformation method:

1. Firstly, the intensity value of the relevant pixel of the distortion-corrected image is divided by the overall Jacobi factor $J=J_x \cdot J_y$ present for this pixel. As a result, a prenormalization of the intensity values is carried out that compensates the changes in intensity, dependent on the Jacobi factor, that occur during the later distribution of the intensity values between the pixels of the equivalent measured image, such as are described in the subsequent third method step.

2. In a second step, knowledge of the field inhomogeneity is then utilized to calculate where the midpoint or centroid of a pixel of the distortion-corrected image is displaced to on the basis of the field inhomogeneities, that is to say the displacement vector ($SH_1$ and $SH_2$ in FIG. 2) is determined. This is performed with the aid of equation (2).

3. The distortion of the pixel is then determined on the basis of the field inhomogeneities, and the original intensity of the pixel of the distortion-corrected image is divided between the pixels of the equivalent measured image in accordance with the area overlap of the approximated rectangular distorted area with the pixels in the grating of the equivalent measured image.

Figure 5:
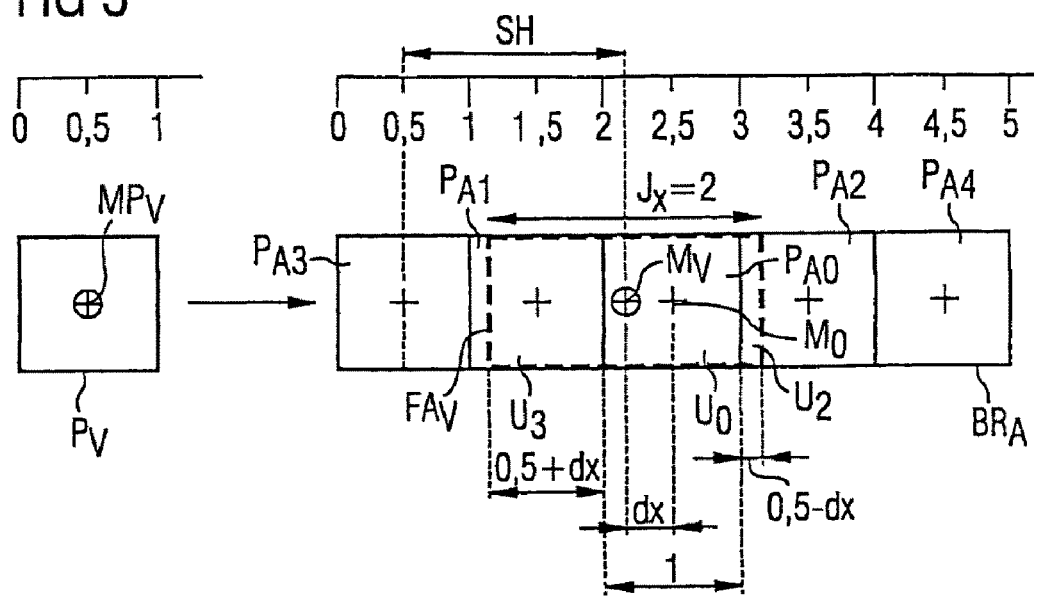
FIG. 5 shows an illustration for explaining the distribution of the intensity fractions of a distorted and displaced pixel of the distortion-corrected image between the pixels of the equivalent measured image in the one-dimensional case.
Figure 6:
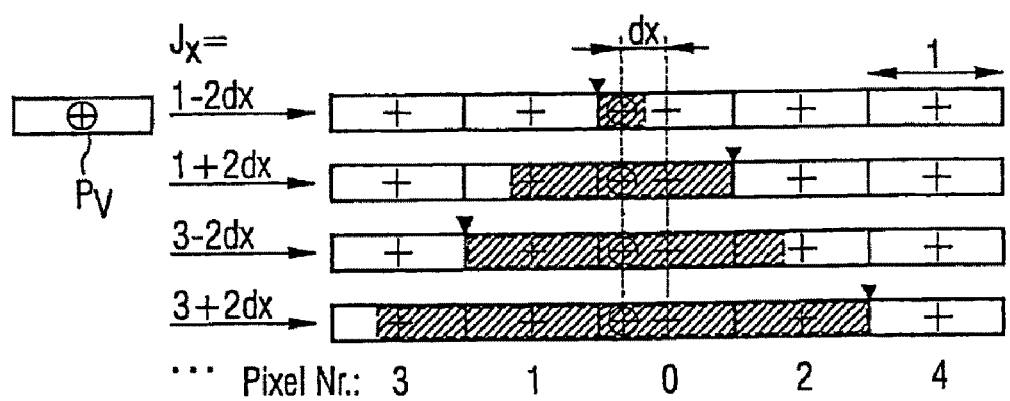
FIG. 6 shows an illustration of the effect of the strength of the field inhomogeneity on the number of the pixels to be taken into account in the case of the area overlap.

The number of the pixels in the equivalent measured image between which the original intensity of the relevant pixel of the distortion-corrected image is distributed is a function, as mentioned, of the Jacobi factors, that is to say the local field inhomogeneities at this point. The maximum extent in the x- and y-directions is known on the basis of knowledge of the image inhomogeneities, and so there is no need during the calculation to take account of more pixels for intensity distribution than is mandatory. Reference may be made to FIGS. 5 and 6 for this purpose.

FIG. 5 shows the calculation of the pixel intensity in the equivalent measured image with reference to an example in which the field inhomogeneity at the pixel $P_V$ of the distortion-corrected image corresponds to a Jacobi factor of $J_x=2$. For the purpose of simplification, the Jacobi factor has been set here in the y-direction $J_y=1$, that is to say no distortion takes place in this direction. Likewise, for the sake of simplicity it is only the case of a simple displacement SH in the x-direction that is illustrated here, since the explanations can be substantially simplified with the aid of such a one dimensional case. However, the extension to the second dimension, that is to say by a displacement of the y-direction with the aid of a Jacobi factor $J_y \neq 1$, can be performed in a primarily analogous fashion.

Illustrated on the left-hand side of FIG. 5 is an individual original pixel $P_V$ in the distortion-corrected image with the midpoint $MP_V$. Illustrated schematically on the right-hand side is an image raster of the equivalent measured image that consists only of a row of five pixels $P_{A0}$, $P_{A0}$, $P_{A2}$, $P_{A3}$, $P_{A4}$ here, for the sake of simplicity. The pixel $P_V$ of the distortion-corrected image is displaced in the image raster $BR_A$ of the equivalent measured image by the distance SH between the original position of the midpoint $MP_V$ (here at 0.5 pixel widths) and the centroid $M_V$, which corresponds to the midpoint, of the distorted displaced area $FA_V$ (here at approximately 2.1 pixel widths). Here, the values relate to the scale depicted at the top in FIG. 5, in which the positions in the image raster are specified in pixel widths. If this displacement vector SH is known, it follows that, given a known midpoint $MP_V$ of the pixel $P_V$ in the raster $BR_V$ of the distortion-corrected image, that it is also possible to determine the centroid $M_V$ of the approximated distorted area $FA_V$ of the original pixel $P_V$, as well as the distance dx thereof from the midpoint $M_0$ of the nearest pixel $P_{A0}$ of the equivalent measured image. The distances from the other pixel midpoints can likewise be calculated.

Since the Jacobi factor $J_x=2$ in the present example, the width of the original pixel $P_V$ is simply doubled. On the basis of this expansion and displacement SH, the pixel $P_V$ now assumes in the image raster $BR_A$ of the equivalent measured image an area $FA_V$ that overlaps the middle image pixel $P_{A0}$ in the image raster $BR_A$ of the equivalent measured image completely, and still partially overlaps the neighboring image pixels $P_{A1}$, $P_{A2}$. The numeration of the pixels $P_{A0}$, $P_{A1}$, $P_{A2}$, $P_{A3}$, $P_{A4}$ is arbitrary in principle, but is performed here for the sake of simplicity in accordance with the distance of the respective midpoints of the individual pixels from the midpoint or centroid $M_V$ of the approximated distorted area $FA_V$ of the original pixel $P_V$, since this notation is also used in the formulas still to follow.

It is also immediately to be seen from FIG. 5 that the number of the overlapped pixels in the equivalent measured image is a function of the Jacobi factor J. Given a Jacobi factor $J_x=2$, the distorted area $FA_V$ assumes the length of precisely two pixels in the x-direction. Consequently, at least two neighboring pixels are overlapped by this area, but at most three neighboring pixels can be overlapped. Furthermore, it is also to be seen that the number of the overlapped pixels is also a function of the geometric displacement of the pixel, specifically finally of the distance dx between the midpoint $M_V$ of the displaced and distorted area $FA_V$ of the original pixel $P_V$ and the midpoint $M_0$ of the nearest pixel $P_{A0}$.

This is explained once again with the aid of FIG. 6, in which the original pixel $P_V$ is illustrated again on the left-hand side (but now somewhat narrower for reasons of space in the y-direction), and the displaced and distorted area inside the image raster $BR_A$ of the equivalent measured image is illustrated on the right-hand side. The displacement vector again respectively corresponds in this case to the displacement vector in FIG. 5. Consequently, the distance dx between the midpoint $M_V$ of the displaced area $FA_V$ and the nearest pixel $P_{A0}$ corresponds to the value of FIG. 5.

However, another Jacobi factor $J_x$ is selected in each row. In the first row, the Jacobi factor $J_x$ corresponds to the value 1-2·dx (units again in pixel width), in the second row it corresponds to the value 1+2·dx, a third row to the value 3-2·dx, and in the fourth row to the value 3+2·dx. Consequently, only one pixel is affected in the first row, that is to say the distorted area lies wholly in the middle pixel. In the second row, two neighboring pixels are affected, three neighboring pixels are affected in the third row, and a total of four neighboring pixels are affected in the fourth row, a new pixel always being added alternatively right and left next to the nearest pixel $P_{A0}$.

It is also possible to illustrate with the aid of FIGS. 5 and 6 that the overlap of the displaced and distorted area $FA_V$ of the original pixel $P_V$ with the pixels $P_{A1}$, $P_{A2}$, acquired only from the edge of the area $FA_V$, in the image raster $BR_A$ of the equivalent measured image is a function of the distance dx between the midpoint $M_V$ of the area $FA_V$ and the nearest pixel $P_{A0}$. The nearest pixel $P_{A0}$ has an overlap area $U_0$ that corresponds to the entire pixel, that is to say this pixel is wholly overlapped. However, of the first pixel $P_{A1}$ lying alongside on the left only an area $U_3$ is affected whose length corresponds in the direction of the raster row to 0.5+dx (units in pixel width). The length of the overlap area $U_2$ of the pixel $P_{A2}$ lying on the right next to the middle pixel $P_{A0}$ corresponds, by contrast, only to the value 0.5−dx.

It is thus possible to define specific inhomogeneity intervals for which it is possible to determine weighting factors W by which it is necessary only to multiply the original intensity of the original pixel $P_V$ in the distortion-corrected image in order to obtain the intensity value that can be assigned to the individual pixels $P_{A0}$, $P_{A1}$, $P_{A2}$, $P_{A3}$, $P_{A4}$ in the equivalent measured image on the basis of this pixel.

The following relationships apply in this case to the example of the rectangular model shown in FIG. 5:

| Inhomogeneity interval | Weighting factor | Affected pixels |
|---|---|---|
| $0 < |J_x| \leq 1 - 2 \cdot dx$ | $W_x[0] = |J_x|$ | 1 |
| $1 - 2 \cdot dx < |J_x| \leq 1 + 2 \cdot dx$ | $W_x[0] = 0.5 \cdot (|J_x| + 1) - dx$<br>$W_x[1] = 0.5 \cdot (|J_x| - 1) + dx$ | 2 |
| $1 + 2 \cdot dx < |J_x| \leq 3 - 2 \cdot dx$ | $W_x[0] = 1$<br>$W_x[1] = 0.5 \cdot (|J_x| - 1) + dx$<br>$W_x[2] = 0.5 \cdot (|J_x| - 1) - dx$ | 3 |
| $3 - 2 \cdot dx < |J_x| \leq 3 + 2 \cdot dx$ | $W_x[0] = 1$<br>$W_x[1] = 0.5 \cdot (|J_x| - 1) + dx$<br>$W_x[2] = 0.5 \cdot (|J_x| - 1) - dx$ | 4 |
| $3 + 2 \cdot dx < |J_x| \leq 5 - 2 \cdot dx$ | $W_x[0] = W_x[1] = W_x[2] = 1$<br>$W_x[3] = 0.5 \cdot (|J_x| - 3) + dx$<br>$W_x[4] = 0.5 \cdot (|J_x| - 3) - dx$ | 5 |
| ... | ... | ... |

$W_x[i]$ in this case denotes the weighting factor in the x-direction for the pixel i, the numeration i=0, 1, 2, 3, 4 ... having been selected in accordance with the distance of the relevant pixel from the midpoint of the displaced area $FA_V$ of the pixel $P_V$ (compare FIG. 5). However, this numeration is fundamentally arbitrary. The last column indicates the number of the pixels, for which the distorted area extends.

In these equations, the parameter $d_x$ likewise again denotes the distance between the midpoint $A_V$ of the displaced area $FA_V$ and the midpoint $M_0$ of the nearest pixel $PA_V$ (compare FIG. 5). The value range can in this case be between 0 and at most half the pixel length.

It is also possible in principle to describe the above-named relationship by means of a general recursive formula (with $k \in \{1, 3, 5, 7, 9, ...\}$):

| Inhomogeneity interval | Weighting factor | Affected pixels |
|---|---|---|
| $0 < |J_x| \leq 1 - 2 \cdot dx$ | $W_x[0] = |J_x|$ | 1 |
| $k - 2 \cdot dx < |J_x| \leq k + 2 \cdot dx$ | $W_x[0] = \ldots = W_x[k - 2] = 1$<br>(if k > 1)<br>$W_x[k - 1] = 0.5 \cdot (|J_x| - (k - 2)) - dx$<br>$W_x[k] = 0.5 \cdot (|J_x| - k)) + dx$ | k + 1 |
| $k + 2 \cdot dx < |J_x| \leq (k + 2) - 2 \cdot dx$ | $W_x[0] = \ldots = W_x[k - 1] = 1$<br>(if k > 1)<br>$W_x[k - 1] = 0.5 \cdot (|J_x| - k) + dx$<br>$W_x[k] = 0.5 \cdot (|J_x| - k) - dx.$ | k + 2 |

The above equations can be explained once again using the following example:

If the Jacobi factor $J_x$ of a distortion-corrected pixel lies in the range of $$1 - 2 \cdot dx < |J_x| \leq 1 + 2 \cdot dx, \qquad (4a)$$

the original intensity of the distortion-corrected pixel is then multiplied by $$W_x[0] = 0.5 \cdot (|J_x| + 1) - dx \qquad (4b)$$

and allocated to the pixel of the equivalent measured image whose midpoint lies closest to the centroid of the displaced and distorted pixel of the distortion-corrected image. The next pixel but one (that is to say the pixel in the equivalent measured image having the second smallest distance from the centroid of the displaced and distorted pixel of the distortion-corrected image) has the intensity fraction $$W_x[1]=0.5\cdot(|J_x|-1)+dx \quad (4c)$$

of the original intensity.

In this way, the distortion-corrected image is run through pixel by pixel, and the original intensities are distributed between the pixels of the equivalent measured image and summed up. The principle applies in an entirely analogous fashion to the y-direction. That is to say, it is possible to calculate an overall weighting factor W per individual pixel that is the product of the individual weighting factors $W_x$ and $W_y$, it being possible to calculate the individual weighting factors $W_x$ and $W_y$ using the abovedescribed system of equations within specific inhomogeneity intervals.

Since the sum of the weighting factors per pixel corresponds to the product $|J_x|\cdot|J_y|$ of the absolute values of the Jacobi factors $J_x$ and $J_y$, the prenormalization described in the first step must be carried out so that the overall weight finally corresponds to 1.

During the calculation, the abovedescribed recursive formula need, however, be implemented only as far as precisely the highest inhomogeneity occurring at all in the magnetic resonance system is being considered. However, the formula can be appropriately expanded at any time if it is to be applied for a magnetic resonance gradient system that then has a higher inhomogeneity. It can thereby be ensured that the outlay on calculation takes up only the computing power that is required by the respective inhomogeneity. Possibly, no unnecessary weighting factors are calculated which would only be equal to 0. This can be illustrated by the following example:

Assumption of concrete values of x=0.1 m, for $G_x$=10 mT/m=0.01 T/m and $\Delta B(x)=x^2/10$ yields the following:

$$J_x = 1 + \frac{x}{5G_x} = 1 + \frac{0.1}{5\cdot 0.01} = 1 + 2 = 3$$

and $$\Delta B(x=0.1) = \frac{(0.1)^2}{10}T = 0.001T = 1mT$$

(that is to say 1000 ppm given a basic field of 1T).

Where $J_x$=3 the highest inhomogeneity occurring in the system, a pixel would be stretched at most to 3 pixels. The algorithm would then have to take account of at most a stretching of 4 pixels since, for an arbitrary position of the centroid of the distorted area, an expansion over 3 pixel lengths can never extend beyond more than 4 pixels.

Figure 7:
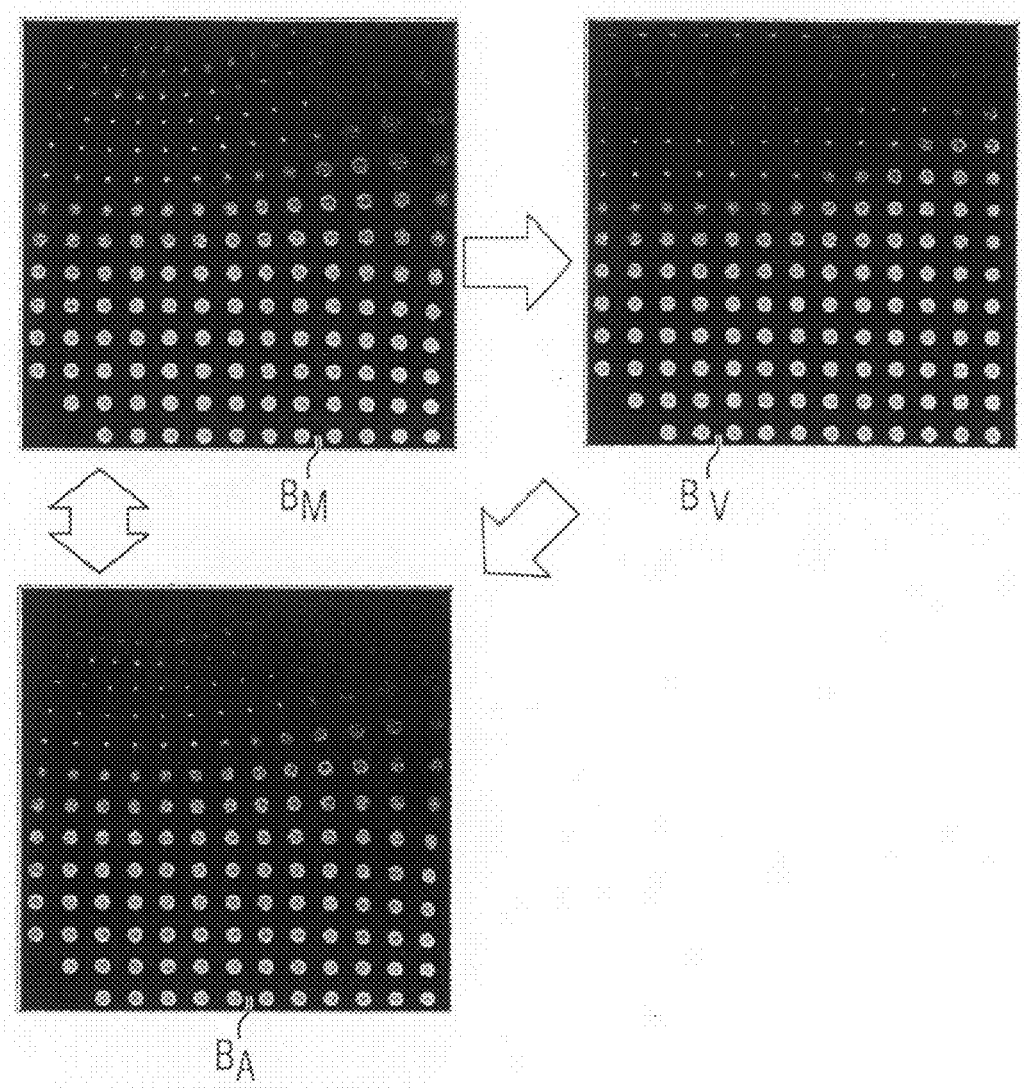
FIG. 7 shows an original measured image of a magnetic resonance measurement of a structured phantom in comparison to a distortion-corrected image, determined therefrom, and an equivalent measured image back transformed from the distortion-corrected image.

FIG. 7 shows first results of magnetic resonance experiments on a specific phantom with a specific point pattern. Reproduced at top left in FIG. 7 is the original measured image, which is obtained during a magnetic resonance measurement without a two dimensional distortion correction. A two-dimensional distortion correction produces therefrom the distortion-corrected image that is illustrated at top right. This image finally reproduces the structure of the phantom exactly, that is to say without distortion.

The image at bottom left shows the equivalent measured image $B_A$ generated from the distortion-corrected image $B_V$ with the aid of the method precisely described above. It is to be seen here straightaway that the original measured image of the equivalent measured image correspond very well. The above-described approximative method for back transformation, which can be carried out exceptionally quickly, is therefore well suited for generating from the distortion-corrected images equivalent measured images that correspond to the original measured images except for slight inaccuracies.

Figure 8:
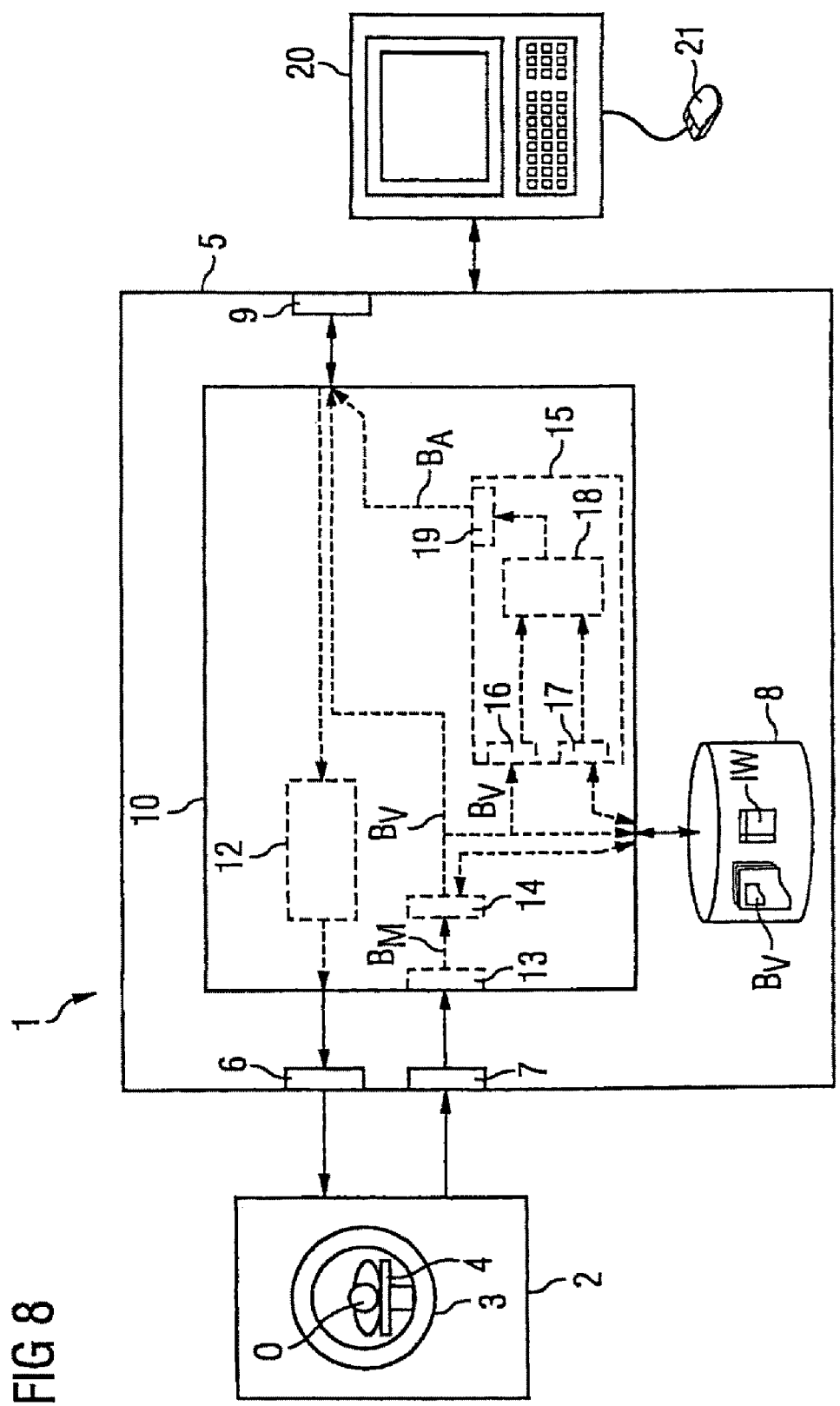
FIG. 8 shows an illustration of the principle of a magnetic resonance system having an image transformation unit according to an embodiment of the invention.

A magnetic resonance system that can be used to carry out an embodiment of the invention is explained below with the aid of FIG. 8.

What is involved here is a magnetic resonance system that is customary per se but in which the system control device 5 has been modified in a suitable way such that the magnetic resonance system 1 has an inventive image transformation unit 15 for carrying out the method according to an embodiment of the invention.

An essential item of this magnetic resonance system 1 is a recording device 2, also termed "tomograph" or "scanner", in which a patient O is positioned on a couch 4 in an annular basic field magnet 3. Located inside the basic field magnet 3 is a radiofrequency antenna (not illustrated) for emitting the magnetic resonance radiofrequency pulses. Moreover, suitable gradient coils (likewise not illustrated) are located in the tomograph 2 in order to set the requisite magnetic field gradients. The tomograph 2 is driven by a system control device 5 that is illustrated separately here. Connected to the system control device 5 via an interface 9 is a terminal 20 that serves as user interface via which an operator operates the system control device 5, and thus the tomograph 2. The system control device 5 further comprises a bulk storage 8 that serves to store images recorded, for example, by way of the magnetic resonance system 1.

The system control device 5 further has a tomograph interface 6 that is connected to the tomograph 2 and, in accordance with the measurement record prescribed by way of the system control device 5, outputs the radiofrequency pulses with the suitable amplitudes and phases, as well as the matching gradient pulses to the matching components of the tomograph 2 in order to carry out a specific measurement. The measurement sequences are controlled on the basis of the prescribed measurement records in this case by using a measurement sequence control unit 12. The operator can communicate with this measurement sequence control unit 12 with the aid of the terminal 22 and thus call up specific measurement records and, if appropriate, modify them or else prescribe new measurement records.

Furthermore, the system control device 5 is connected to the tomograph 2 via an acquisition interface 7. The acquisition interface 7 is used to acquire the raw data RD that come from the tomograph 2 and are reconstructed in an image reconstruction unit 13 to form the desired magnetic resonance images.

These magnetic resonance images are then corrected for distortion in a distortion correction unit 14 (which, however, can also already be a component of the image reconstruction unit 13). The distortion-corrected magnetic resonance images $B_V$ can then be displayed via the interface 9 on the terminal 20 individually or also in a fashion assembled by an isocenter scanning method, and/or be stored in the memory 8.

In particular, the images $B_V$ can also be used in principle on the terminal 20 to carry out planning for further measurements, doing so by using a mouse 21 or another pointing device of a graphics user interface to mark specific areas in the images at which further measurements, for example single voxel spectroscopy, are then carried out. In this case, spatial coordinates $x_O$, at which the spectroscopy is to be carried out, generated with the aid of the user interface are then sent to the measurement sequence control unit 12 such that the measurement sequences for the measurements to be carried out are appropriately generated there. In order to be able to determine the spatial coordinates $x_O$ correctly, it is, however, necessary—as already described at the beginning—to have available images that are not corrected for distortion.

To this end, the system control unit 5 has an image transformation unit 15. This image transformation unit 15 can call up distortion-corrected images $B_V$ from the memory 8 by means of an interface 16. Moreover, this image transformation unit 15 has a field inhomogeneity determination unit. What is involved here is a further interface 17 with the aid of which the inhomogeneity values IW of the system 1 that are stored in a database in the memory 8 can be called up. With the aid of these determined inhomogeneity values IW, the abovedescribed calculations for the individual image pixels of the distortion-corrected image $B_V$ are carried out inside an image pixel calculating unit 18, and an equivalent measured image $B_A$ is thus generated. The latter can be output in turn via the interface 19 of the image transformation unit 15 and, for example, be stored in the memory 8, or be displayed directly on the screen of the terminal 20 via the interface 9 such that it is possible then to use this equivalent measured image $B_A$ to determine the correct spatial coordinates $x_0$ for the subsequent measurements.

The measurement sequence control unit 12, the image reconstruction unit 13, the distortion correction unit 14 and the complete image transformation unit 15 together with all the interfaces 16, 17, 19 and the image pixel calculating unit 18 can be implemented in the form of suitable software components, as here on a microprocessor 10, or alternatively of a number of networked microprocessors, of the system control device 5.

Both the system control device 5 and the terminal 20 and the memory 8 can also be an integral component of the tomograph 2. However, it is likewise also possible for the system control device 5 to comprise a number of individual components. In particular, for example, the mass storage 8 can, like the terminal 21, be connected via an interface to the system control device 5, instead of being integrated therein.

Moreover, the entire magnetic resonance system 1 also has all the further usual components and features such as, for example, interfaces for connection to a communications network, for example an image information system. All these components that are not necessary for understanding embodiments of the invention are, however, not illustrated in FIG. 1 for reasons of better clarity.

It is likewise also possible for the image transformation unit to be implemented on another computer unit, for example connected to the system control unit 5 via a bus system, there being connected in turn to said computer unit a suitable terminal via which an operator, for example a doctor, can view images and carry out appropriate planning and/or define spatial coordinates for further measurements.

It may be pointed out once more in conclusion that the method described above in detail and the magnetic resonance system illustrated are merely example embodiments that can be modified by the person skilled in the art in multifarious ways without departing from the scope of the invention. Embodiments of the invention have been explained predominantly with the aid of its use in a magnetic resonance system employed in medicine. However, it is not limited to such use, but can also be employed in scientific and/or industrial uses.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for transforming a distortion-corrected magnetic resonance image, generated on the basis of an original magnetic resonance measured image acquired by a magnetic resonance system into an equivalent measured image, the method, carried out for individual pixels defined in an image raster of the distortion-corrected magnetic resonance image, comprising:
   determining field inhomogeneity values, using one or more processors, of the magnetic resonance system at a location of a relevant pixel;
   calculating displacement, using one or more of the processors, of the relevant pixel on the basis of the determined field inhomogeneity values;
   determining a distorted area, using one or more of the processors, of the relevant pixel on the basis of the determined field inhomogeneity values;
   determining an overlap, using one or more of the processors, of the determined distorted area of the relevant pixel with areas of pixels defined in an image raster of the equivalent measured image; and
   splitting an intensity value, using one or more of the processors, of the relevant pixel of the distortion-corrected magnetic resonance image between the pixels of the equivalent measured image in accordance with the determined overlap.

2. The method as claimed in claim 1, wherein the distorted area of a pixel of the distortion-corrected magnetic resonance image is approximated by an area with a simple geometric shape.

3. The method as claimed in claim 2, wherein the distorted area of a pixel of the distortion-corrected magnetic resonance image is approximated by at least one of a rectangular and octagonal area.

4. The method as claimed in claim 1, wherein the dimensions of the distorted area of a pixel of the distortion-corrected magnetic resonance image are determined on the basis of direction dependent Jacobi factors that respectively represent a local field gradient at the location of the relevant pixel.

5. The method as claimed in claim 1, wherein weighting factors are determined for the relevant pixel that respectively represent an overlap of the distorted area of the relevant displaced pixel with an area of a pixel of the equivalent measured image, and the splitting of intensity value of the relevant displaced pixel of the distortion-corrected magnetic resonance image between the pixels of the equivalent measured image is performed in a fashion proportional to the determined weighting factors.

6. The method as claimed in claim 5, wherein, at least for some of the pixels of the equivalent measured image, the weighting factors are determined as a function of a distance of the respective midpoint of the relevant pixel of the equivalent measured image from the midpoint of the displaced and distorted area.

7. The method as claimed in claim 6, wherein the weighting factors are determined as a function of the number of the pixels of the equivalent measured image with the aid of which the distorted surface at least partially overlaps.

8. The method as claimed in claim 7, wherein there are defined in a specific direction, as a function of a distance of the centroid of the distorted area from the midpoint of the nearest pixel of the equivalent measured image, inhomogeneity intervals that are respectively assigned specific weighting factors for the individual pixels of equivalent measured image as a function of the distance of the centroid of the distorted area from the midpoint of the nearest pixel, and the intensity fractions of the relevant pixels of the equivalent measured image are assigned as a function of a specific one of these weighting factors when the direction dependent Jacobi factor present for the relevant pixel of the distortion-corrected image lies in the pertinent intensity interval.

9. The method as claimed in claim 1, wherein the intensity value of the relevant pixel of the distortion-corrected magnetic resonance image is normalized as a function of a Jacobi factor.

10. A method for carrying out at least one magnetic resonance measurement on an examination object in a magnetic resonance system, the method comprising:
using a magnetic resonance image of the examination object, previously acquired via the magnetic resonance system, to determine spatial coordinates in order to control the magnetic resonance system for the at least one magnetic resonance measurement to be carried out, wherein, to determine the spatial coordinates, a distortion-corrected magnetic resonance image is used, acquired by the magnetic resonance system, generated on the basis of an original magnetic resonance measured image and transformed in advance into an equivalent measured image on the basis of field inhomogeneity values of the magnetic resonance system, wherein the transforming occurs via the method as claimed in claim 1.

11. A computer program product, directly loadable into a memory of a programmable computer unit, including program code segments to execute the method as claimed in claim 1 when the program is executed on the computer unit.

12. A computer readable medium including program segments for, when executed on a computer device, causing the computer device to implement the method of claim 1.

13. An image transformation unit for transforming into an equivalent measured image of a distortion-corrected magnetic resonance image generated on the basis of an original magnetic resonance measured image acquired by a magnetic resonance system, comprising:
an interface to acquire a distortion-corrected magnetic resonance image;
a field inhomogeneity determination unit to determine field inhomogeneity values of the magnetic resonance system;
an image pixel calculating unit to carry, out the following for the individual pixels defined in an image raster of the distortion-corrected magnetic resonance image,
calculating a displacement of the relevant pixel on the basis of the determined field inhomogeneity values,
determining a distorted area of the relevant pixel on the basis of the determined field inhomogeneity values;
calculating an overlap of the determined distorted area of the relevant pixel with areas of pixels defined in an image raster of the equivalent measured image,
splitting an intensity value of the relevant pixel of the distortion-corrected magnetic resonance image between the pixels of the equivalent measured image in accordance with the determined overlap, and
an interface to output the equivalent measured image.

14. A magnetic resonance system comprising an image transformation unit as claimed in claim 13.

15. A method for a magnetic resonance system, the method comprising:
acquiring, using one or more processors, via the magnetic resonance system, an original magnetic resonance measured image of the examination object;
generating, using one or more of the processors, a distortion-corrected magnetic resonance image based on the original magnetic resonance measured image;
transforming, using one or more of the processors, the distortion-corrected magnetic resonance image into an equivalent measured image on the basis of field inhomogeneity values of the magnetic resonance system; and
determining, using one or more of the processors, spatial coordinates of the equivalent measured image to control the magnetic resonance system.

16. The method of claim 15, further comprising:
carrying out at least one magnetic resonance measurement on the magnetic resonance system based upon the determined spatial coordinates.

17. The method of claim 15, further comprising:
controlling the magnetic resonance system based upon the determined spatial coordinates.

18. A computer readable medium including program segments for, when executed on a computer device, causing the computer device to implement the method of claim 15.

* * * * *

UNITED STATES PATENT AND TRADEMARK OFFICE
CERTIFICATE OF CORRECTION

| | | |
|---|---|---|
| PATENT NO. | : 7,902,824 B2 | Page 1 of 1 |
| APPLICATION NO. | : 12/662152 | |
| DATED | : March 8, 2011 | |
| INVENTOR(S) | : Harald Werthner | |

It is certified that error appears in the above-identified patent and that said Letters Patent is hereby corrected as shown below:

Title Page, Item (30) is inserted to read

--(30) Foreign Application Priority Data

July 18, 2006   (DE) ................. 10 2006 033 248.2--

Signed and Sealed this
Twenty-seventh Day of March, 2012

David J. Kappos
*Director of the United States Patent and Trademark Office*